(12) United States Patent
Lee

(10) Patent No.: US 10,847,510 B2
(45) Date of Patent: Nov. 24, 2020

(54) RF POWER DEVICE CAPABLE OF MONITORING TEMPERATURE AND RF CHARACTERISTICS AT WAFER LEVEL

(71) Applicant: Sang-Hun Lee, Gyeonggi-do (KR)

(72) Inventor: Sang-Hun Lee, Gyeonggi-do (KR)

( * ) Notice: Subject to any disclaimer, the term of this patent is extended or adjusted under 35 U.S.C. 154(b) by 66 days.

(21) Appl. No.: 16/202,371

(22) Filed: Nov. 28, 2018

(65) Prior Publication Data

US 2019/0096873 A1  Mar. 28, 2019

Related U.S. Application Data

(63) Continuation of application No. PCT/KR2017/007682, filed on Jul. 18, 2017.

(51) Int. Cl.
| | | |
|---|---|---|
| *H01L 27/02* | (2006.01) | |
| *H01L 27/06* | (2006.01) | |
| *H01L 23/34* | (2006.01) | |
| *H01L 23/528* | (2006.01) | |
| *G01R 31/40* | (2020.01) | |
| *G01R 31/28* | (2006.01) | |
| *H01L 21/66* | (2006.01) | |
| *G01R 31/26* | (2020.01) | |

(52) U.S. Cl.
CPC ...... *H01L 27/0251* (2013.01); *G01R 31/2822* (2013.01); *G01R 31/40* (2013.01); *H01L 22/34* (2013.01); *H01L 23/34* (2013.01); *H01L 23/5286* (2013.01); *G01R 31/2644* (2013.01); *G01R 31/2831* (2013.01); *H01L 27/0605* (2013.01); *H01L 27/0629* (2013.01)

(58) Field of Classification Search
CPC ..... H01L 27/0251; H01L 22/34; H01L 23/34; G01R 31/2822; G01R 31/40

USPC .......................................................... 257/48
See application file for complete search history.

(56) References Cited

U.S. PATENT DOCUMENTS

| | | | |
|---|---|---|---|
| 6,671,152 B1 | 12/2003 | Hersel et al. | |
| 8,013,673 B2* | 9/2011 | Makioka | H03F 1/32 330/124 R |
| 9,820,401 B2 | 11/2017 | Zhu et al. | |
| 2004/0041168 A1* | 3/2004 | Hembree | H01L 22/34 257/173 |
| 2008/0186035 A1* | 8/2008 | Franch | G01K 7/01 324/713 |

(Continued)

FOREIGN PATENT DOCUMENTS

| | | |
|---|---|---|
| JP | 2014-232062 A | 12/2014 |
| KR | 10-2006-0084306 A | 7/2006 |
| KR | 10-2008-0063974 A | 7/2008 |

*Primary Examiner* — Sheikh Maruf
(74) *Attorney, Agent, or Firm* — Harness, Dickey & Pierce, P.L.C.

(57) ABSTRACT

The present disclosure provides an RF power device including: a single RF power transistor; a pad spaced apart from the single RF power transistor and configured to transmit a temperature and RF characteristic information of the single RF power transistor to an outside; and a temperature and RF characteristic detector connected between the pad and the ground and configured to detect the temperature and the RF characteristics of the single RF power transistor, and is characterized in that the ground is connected to the single RF power transistor, and the single RF power transistor, the pad, and the temperature and RF characteristic detector are manufactured on the same wafer.

16 Claims, 2 Drawing Sheets

(56) References Cited

U.S. PATENT DOCUMENTS

| | | | |
|---|---|---|---|
| 2008/0197407 A1* | 8/2008 | Challa | H01L 29/7831 |
| | | | 257/330 |
| 2009/0001364 A1* | 1/2009 | Segawa | H01L 24/06 |
| | | | 257/48 |
| 2009/0085599 A1* | 4/2009 | Choi | H01L 23/60 |
| | | | 324/750.27 |
| 2009/0085666 A1* | 4/2009 | Ohnishi | H03F 1/565 |
| | | | 330/286 |
| 2011/0018060 A1* | 1/2011 | Botula | H01L 21/76283 |
| | | | 257/347 |
| 2011/0169576 A1* | 7/2011 | Okuda | H01L 23/66 |
| | | | 330/307 |
| 2012/0268211 A1* | 10/2012 | Ng | H03F 1/56 |
| | | | 330/277 |
| 2013/0141114 A1* | 6/2013 | Botula | H01L 22/34 |
| | | | 324/615 |
| 2014/0284701 A1* | 9/2014 | Korec | H01L 29/872 |
| | | | 257/328 |
| 2015/0156910 A1* | 6/2015 | Zhu | H03F 3/189 |
| | | | 361/728 |
| 2016/0261236 A1* | 9/2016 | Kuroda | H03F 3/602 |
| 2017/0026009 A1* | 1/2017 | Xue | H03F 1/565 |
| 2017/0229445 A1* | 8/2017 | Maehara | H01L 27/0629 |
| 2018/0323295 A1* | 11/2018 | Okayasu | H01L 29/2003 |
| 2019/0172826 A1* | 6/2019 | Or-Bach | H01L 27/0688 |

* cited by examiner

RF POWER DEVICE CAPABLE OF MONITORING TEMPERATURE AND RF CHARACTERISTICS AT WAFER LEVEL

CROSS REFERENCE TO RELATED APPLICATIONS

This application is a continuation application of PCT Application No. PCT/KR2017/007682, filed on Jul. 18, 2017. The entire disclosures of the application identified in this paragraph are incorporated herein by reference.

FIELD

The present disclosure relates to a radio frequency (RF) power device capable of monitoring a temperature and RF characteristics at a wafer level, and more particularly, to an RF power device capable of monitoring a temperature and RF characteristics at a wafer level, which can effectively prevent a damage from being applied to the RF power device or a system employing the same, by precisely monitoring a temperature and RF characteristics of the RF power device at a wafer level.

BACKGROUND

In general, when the temperature of an RF power device increases to be higher than an allowable degree, the temperature abruptly increases by self-heating or mutual heating. In addition, in the case of an RF power device for high output, it may be difficult to exactly measure RF characteristics at a wafer level due to a high output current. Due to the high output current, the increasing temperature, and the inexactly measured RF characteristics, it may be difficult to exactly determine whether the RF power device is a good or defective product at a wafer level, and the RF power device in such an unverified state is used. As a result, an irreversible damage may be applied not only to the RF power device but also to a power amplifier module employing the RF power device.

A related-art method is using an infrared (IR) image to monitor a temperature and RF characteristics of a power amplifier device. However, if the power amplifier device is integrated into a package, it may be difficult to use the IR image.

The background art of the present disclosure was disclosed in Korean Patent Publication No. 10-2008-0063974 on Jul. 8, 2008.

SUMMARY

An object of the present disclosure suggested to solve the above-mentioned problems is to provide an RF power device capable of monitoring a temperature and RF characteristics at a wafer level, which can effectively prevent a damage from being applied to the RF power device or a system employing the same, by precisely monitoring a temperature and RF characteristics of the RF power device at a wafer level.

According to a first embodiment of the present disclosure, there is provided an RF power device which is capable of monitoring a temperature and RF characteristics at a wafer level, the RF power device including: a single RF power transistor; a pad spaced apart from the single RF power transistor and configured to transmit a temperature and RF characteristic information of the single RF power transistor to an outside; and a temperature and RF characteristic detector connected between the pad and the ground and configured to detect the temperature and the RF characteristics of the single RF power transistor, wherein the ground is connected to the single RF power transistor, and the single RF power transistor, the pad, and the temperature and RF characteristic detector are manufactured on a same wafer.

In the RF power device capable of monitoring the temperature and the RF characteristics at the wafer level according to the first embodiment of the present disclosure, the single RF power transistor may be manufactured with any one of GaAs, InP, GaN, or may be a complementary metal oxide semiconductor (CMOS).

In the RF power device capable of monitoring the temperature and the RF characteristics at the wafer level according to the first embodiment of the present disclosure, the temperature and RF characteristic detector may be a negative temperature coefficient (NTC) thermistor, a positive temperature coefficient (PTC) thermistor, a resistor, a capacitor, or an inductor.

In the RF power device capable of monitoring the temperature and the RF characteristics at the wafer level according to the first embodiment of the present disclosure, a spacing distance between the single RF power transistor and the temperature and RF characteristic detector may be a minimum value of a range for preventing a short circuit of a layout design rule of the single RF power transistor.

According to a second embodiment of the present disclosure, there is provided an RF power device which is capable of monitoring a temperature and RF characteristics at a wafer level, the RF power device including: a single RF power transistor; a pad spaced apart from the single RF power transistor and configured to transmit a temperature and RF characteristic information of the single RF power transistor to an outside; and a temperature and RF characteristic detector connected between the pad and a source of the single RF power transistor and configured to detect the temperature and the RF characteristics of the single RF power transistor, wherein the single RF power transistor, the pad, and the temperature and RF characteristic detector are manufactured on a same wafer.

In the RF power device capable of monitoring the temperature and the RF characteristics at the wafer level according to the second embodiment of the present disclosure, the single RF power transistor may be manufactured with any one of GaAs, InP, GaN, or may be a complementary metal oxide semiconductor (CMOS).

In the RF power device capable of monitoring the temperature and the RF characteristics at the wafer level according to the second embodiment of the present disclosure, the temperature and RF characteristic detector may be a negative temperature coefficient (NTC) thermistor, a positive temperature coefficient (PTC) thermistor, a resistor, a capacitor, or an inductor.

In the RF power device capable of monitoring the temperature and the RF characteristics at the wafer level according to the second embodiment of the present disclosure, a spacing distance between the single RF power transistor and the temperature and RF characteristic detector may be a minimum value of a range for preventing a short circuit of a layout design rule of the single RF power transistor.

According to a third embodiment of the present disclosure, there is provided an RF power device which is capable of monitoring a temperature and RF characteristics at a wafer level, the RF power device including: a transistor group having a plurality of RF power transistors connected with one another in parallel; a pad spaced apart from the transistor group and configured to transmit a temperature and RF characteristic information of the transistor group to an outside; and a temperature and RF characteristic detector connected between the pad and the ground and configured to detect the temperature and the RF characteristics of the transistor group, wherein the ground is connected to the plurality of RF power transistors of the transistor group, respectively, and the transistor group, the pad, and the temperature and RF characteristic detector are manufactured on a same wafer.

In the RF power device capable of monitoring the temperature and the RF characteristics at the wafer level according to the third embodiment of the present disclosure, each of the plurality of RF power transistors of the transistor group may be manufactured with any one of GaAs, InP, GaN, or may be a complementary metal oxide semiconductor (CMOS).

In the RF power device capable of monitoring the temperature and the RF characteristics at the wafer level according to the third embodiment of the present disclosure, the temperature and RF characteristic detector may be a negative temperature coefficient (NTC) thermistor, a positive temperature coefficient (PTC) thermistor, a resistor, a capacitor, or an inductor.

In the RF power device capable of monitoring the temperature and the RF characteristics at the wafer level according to the third embodiment of the present disclosure, a spacing distance between the transistor group and the temperature and RF characteristic detector is a minimum value of a range for preventing a short circuit of a layout design rule of each of the plurality of RF power transistors of the transistor group.

According to a fourth embodiment of the present disclosure, there is provided an RF power device which is capable of monitoring a temperature and RF characteristics at a wafer level, the RF power device including: a transistor group having a plurality of RF power transistors connected with one another in parallel; a pad spaced apart from the transistor group and configured to transmit a temperature and RF characteristic information of the transistor group to an outside; and a temperature and RF characteristic detector connected between the pad and a source of an RF power transistor that is closest to the pad among the transistor group, and configured to detect the temperature and the RF characteristics of the transistor group, wherein the transistor group, the pad, and the temperature and RF characteristic detector are manufactured on a same wafer.

In the RF power device capable of monitoring the temperature and the RF characteristics at the wafer level according to the fourth embodiment of the present disclosure, each of the plurality of RF power transistors of the transistor group may be manufactured with any one of GaAs, InP, GaN, or may be a complementary metal oxide semiconductor (CMOS).

In the RF power device capable of monitoring the temperature and the RF characteristics at the wafer level according to the fourth embodiment of the present disclosure, the temperature and RF characteristic detector may be a negative temperature coefficient (NTC) thermistor, a positive temperature coefficient (PTC) thermistor, a resistor, a capacitor, or an inductor.

In the RF power device capable of monitoring the temperature and the RF characteristics at the wafer level according to the fourth embodiment of the present disclosure, a spacing distance between the transistor group and the temperature and RF characteristic detector may be a minimum value of a range for preventing a short circuit of a layout design rule of each of the plurality of RF power transistors of the transistor group.

According to the present disclosure, since the temperature and the RF characteristics of the RF power device can be precisely monitored at the wafer level, there is an effect of effectively preventing a damage from being applied to the RF power device or a system employing the same.

DETAILED DESCRIPTION

Figure 1:
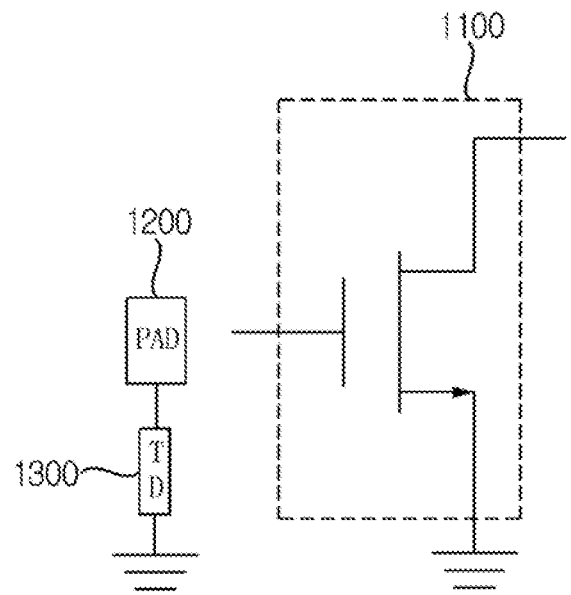
FIG. 1 is a circuit diagram of an RF power device capable of monitoring a temperature and RF characteristics at a wafer level according to a first embodiment of the present disclosure.

Specific matters of other embodiments are included in the detailed description and the drawings. Exemplary embodiments will now be described more fully with reference to the accompanying drawings to clarify advantages and features of the present disclosure, and a method for achieving the same. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art, and the present disclosure is defined only by the scope of the claims. The same reference numerals indicate the same elements throughout the specification.

As shown in FIG. 1, an RF power device capable of monitoring a temperature and RF characteristics at a wafer level according to a first embodiment of the present disclosure includes a single RF power transistor 1100, a pad 1200 spaced apart from the single RF power transistor 1100 to transmit the temperature and RF characteristics information of the single RF power transistor 1100 to the outside, and a temperature and RF characteristic detector 1300 connected between the pad 1200 and the ground to detect the temperature and the RF characteristics of the single RF power transistor 1100.

The ground is connected to the single RF power transistor 1100, and the single RF power transistor 1100, the pad 1200, and the temperature and RF characteristic detector 1300 are manufactured on the same wafer.

Herein, the single RF power transistor 1100 may be manufactured with any one of GaAs, InP, GaN, or may be a complementary metal oxide semiconductor (CMOS). The temperature and RF characteristic detector 1300 may be configured by using a negative temperature coefficient (NTC) thermistor, a positive temperature coefficient (PTC) thermistor, a resistor, a capacitor, or an inductor.

When a spacing distance between the single RF power transistor 1100 and the temperature and RF characteristic detector 1300 is set to a minimum value of a range for preventing a short circuit of a layout design rule of the single RF power transistor 1100, the temperature and RF characteristic detector 1300 may more precisely detect the temperature and the RF characteristics of the single RF power transistor 1100.

Figure 2:
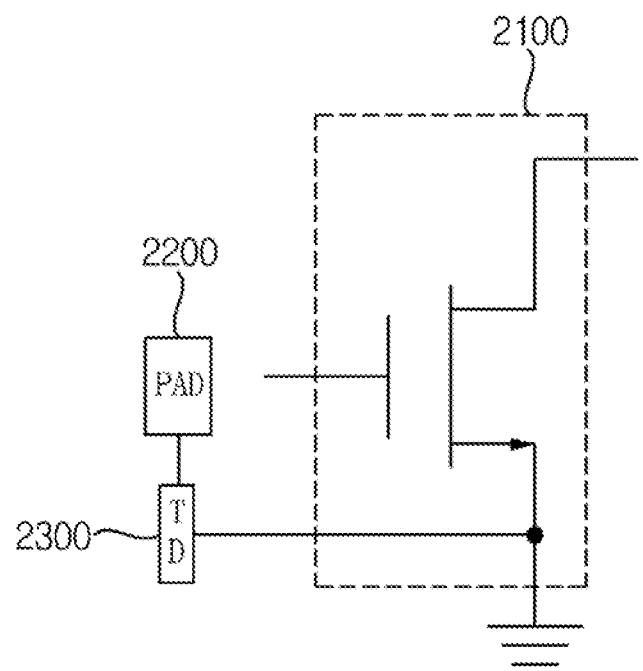
FIG. 2 is a circuit diagram of an RF power device capable of monitoring a temperature and RF characteristics at a wafer level according to a second embodiment of the present disclosure.

As shown in FIG. 2, an RF power device capable of monitoring a temperature and RF characteristics at a wafer level according to a second embodiment of the present disclosure includes a single RF power transistor 2100, a pad 2200 spaced apart from the single RF power transistor 2100 to transmit the temperature and the RF characteristics information of the single RF power transistor 2100 to the outside, and a temperature and RF characteristic detector 2300 connected between the pad 2200 and a source of the single RF power transistor 2100 to detect the temperature and the RF characteristics of the single RF power transistor 2100. The single RF power transistor 2100, the pad 2200, and the temperature and RF characteristic detector 2300 are manufactured on the same wafer.

The temperature and RF characteristic detector 2300 of the RF power device, which is capable of monitoring the temperature and the RF characteristics at the wafer level, according to the second embodiment of the present disclosure, differs from the temperature and the RF characteristic detector 1300 of the RF power device, which is capable of monitoring the temperature and the RF characteristics at the wafer level, according to the first embodiment of the present disclosure, in that the temperature and RF characteristic detector 2300 is connected to the source of the single RF power transistor 2100, and the other parts are the same.

Figure 3:
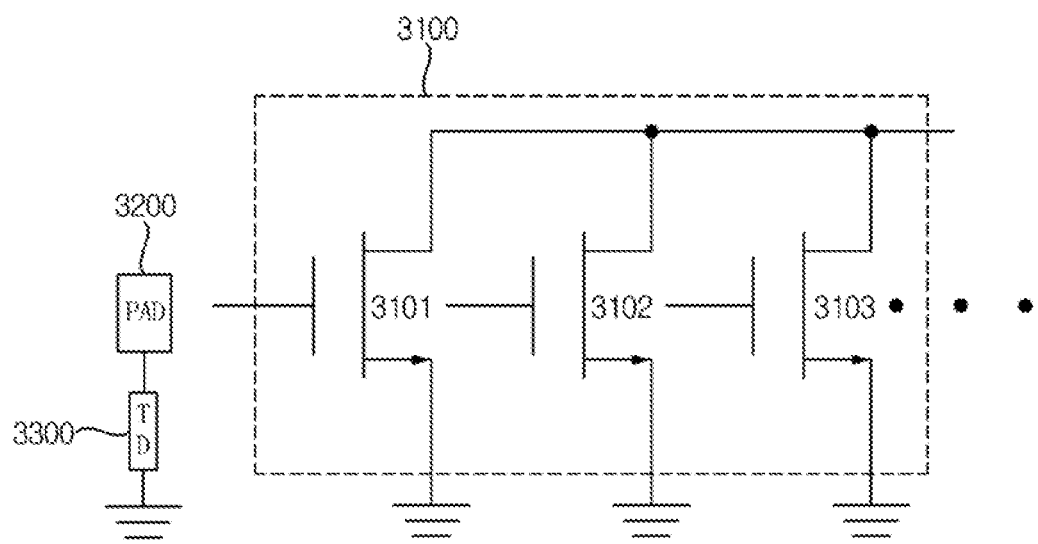
FIG. 3 is a circuit diagram of an RF power device capable of monitoring a temperature and RF characteristics at a wafer level according to a third embodiment of the present disclosure.

As shown in FIG. 3, an RF power device capable of monitoring a temperature and RF characteristics at a wafer level according to a third embodiment of the present disclosure includes a transistor group 3100 having a plurality of RF power transistors 3101, 3102, 3103 connected with one another in parallel, a pad 3200 spaced apart from the transistor group 3100 to transmit the temperature and the RF characteristics information of the transistor group 3100 to the outside, and a temperature and RF characteristic detector 3300 connected between the pad 3200 and the ground to detect the temperature and the RF characteristics of the transistor group 3100. The ground is connected to the plurality of RF power transistors 3101, 3102, 3103 of the transistor group 3100, respectively, and the transistor group 3100, the pad 3200, and the temperature and RF characteristic detector 3300 are manufactured on the same wafer.

The transistor group 3100 of the RF power device, which is capable of monitoring the temperature and the RF characteristics at the wafer level, according to the third embodiment of the present disclosure, differs from the single RF power transistor 1100 of the RF power device, which is capable of monitoring the temperature and the RF characteristics at the wafer level, according to the first embodiment of the present disclosure, in that the plurality of RF power transistors 3101, 3102, 3103 are connected with one another in parallel, and the other parts are the same.

Figure 4:
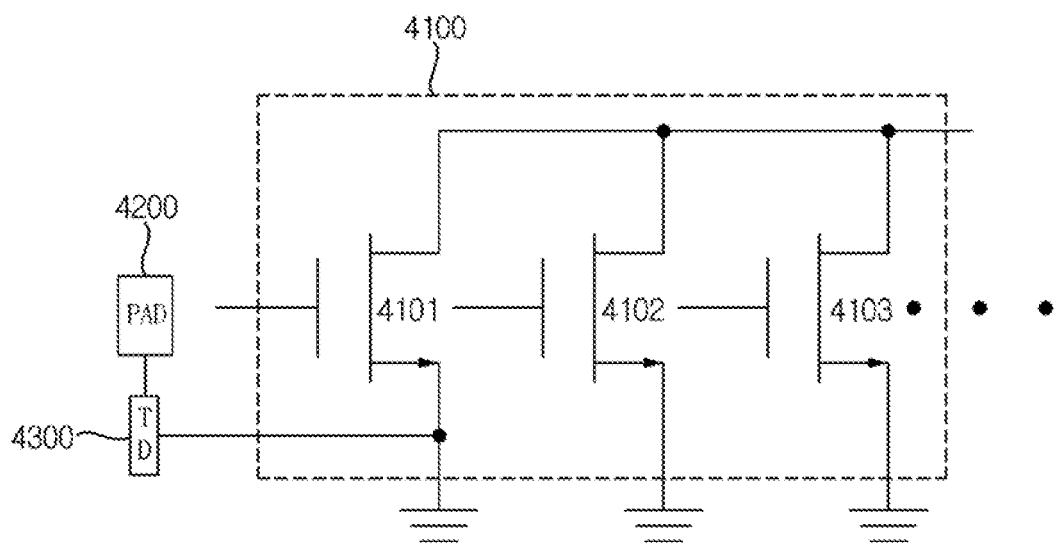
FIG. 4 is a circuit diagram of an RF power device capable of monitoring a temperature and RF characteristics at a wafer level according to a fourth embodiment of the present disclosure.

As shown in FIG. 4, an RF power device capable of monitoring a temperature and RF characteristics at a wafer level according to a fourth embodiment of the present disclosure includes a transistor group 4100 having a plurality of RF power transistors 4101, 4102, 4103 connected with one another in parallel, a pad 4200 spaced apart from the transistor group 4100 to transmit the temperature and the RF characteristics information of the transistor group 4100 to the outside, and a temperature and RF characteristic detector 4300 connected between the pad 4200 and a source of the RF power transistor 4101 that is closest to the pad 4200 among the transistor group 4100 to detect the temperature and the RF characteristics of the transistor group 4100. The transistor group 4100, the pad 4200, and the temperature and RF characteristic detector 4300 are manufactured on the same wafer.

The temperature and RF characteristic detector 4300 of the RF power device, which is capable of monitoring the temperature and the RF characteristics at the wafer level, according to the fourth embodiment of the present disclosure, differs from the temperature and RF characteristic detector 3300 of the RF power device, which is capable of monitoring the temperature and the RF characteristics at the wafer level, according to the third embodiment of the present disclosure, in that the temperature and RF characteristic detector 4300 is connected to the source of the RF power transistor 4101 that is closest to the pad 4200 among the transistor group 4100, and the other parts are the same.

It will be understood by those skilled in the art that the present disclosure can be embodied in other specific forms without changing the technical idea or essential features of the present disclosure.

Therefore, it should be understood that the embodiments described above are merely examples from all aspects and are not limited.

The scope of the present disclosure should be defined not by the detailed description, but by the appended claims, and the meaning and the scope of the claims and all changes or changed forms derived from the equivalent concept thereof should be interpreted as being included in the scope of the present disclosure.

What is claimed is:

1. An RF power device comprising:
   a single RF power transistor;
   a pad physically spaced apart and electrically disconnected from the single RF power transistor and configured to transmit a temperature and RF characteristic information of the single RF power transistor to an outside; and
   a temperature and RF characteristic detector connected between the pad and the ground and configured to detect the temperature and the RF characteristics of the single RF power transistor,
   wherein the ground is connected to the single RF power transistor, and the single RF power transistor, the pad, and the temperature and RF characteristic detector are manufactured on a same wafer.

2. The RF power device of claim 1, wherein the single RF power transistor is manufactured with any one of GaAs, InP, GaN, or is a complementary metal oxide semiconductor (CMOS).

3. The RF power device of claim 1, wherein the temperature and RF characteristic detector is a negative temperature coefficient (NTC) thermistor, a positive temperature coefficient (PTC) thermistor, a resistor, a capacitor, or an inductor.

4. The RF power device of claim 1, wherein a spacing distance between the single RF power transistor and the temperature and RF characteristic detector is a minimum value of a range for preventing a short circuit of a layout design rule of the single RF power transistor.

5. An RF power device comprising:
   a single RF power transistor;
   a pad physically spaced apart and electrically disconnected from the single RF power transistor and configured to transmit a temperature and RF characteristic information of the single RF power transistor to an outside; and a temperature and RF characteristic detector connected between the pad and a source of the single RF power transistor and configured to detect the temperature and the RF characteristics of the single RF power transistor, wherein the single RF power transistor, the pad, and the temperature and RF characteristic detector are manufactured on a same wafer.

6. The RF power device of claim 5, wherein the single RF power transistor is manufactured with any one of GaAs, InP, GaN, or is a complementary metal oxide semiconductor (CMOS).

7. The RF power device of claim 5, wherein the temperature and RF characteristic detector is a negative temperature coefficient (NTC) thermistor, a positive temperature coefficient (PTC) thermistor, a resistor, a capacitor, or an inductor.

8. The RF power device of claim 5, wherein a spacing distance between the single RF power transistor and the temperature and RF characteristic detector is a minimum value of a range for preventing a short circuit of a layout design rule of the single RF power transistor.

9. An RF power device comprising:
a transistor group having a plurality of RF power transistors connected with one another in parallel;
a pad physically spaced apart and electrically disconnected from the transistor group and configured to transmit a temperature and RF characteristic information of the transistor group to an outside; and
a temperature and RF characteristic detector connected between the pad and the ground and configured to detect the temperature and the RF characteristics of the transistor group,
wherein the ground is connected to the plurality of RF power transistors of the transistor group, respectively, and the transistor group, the pad, and the temperature and RF characteristic detector are manufactured on a same wafer.

10. The RF power device of claim 9, wherein each of the plurality of RF power transistors of the transistor group is manufactured with any one of GaAs, InP, GaN, or is a complementary metal oxide semiconductor (CMOS).

11. The RF power device of claim 9, wherein the temperature and RF characteristic detector is a negative temperature coefficient (NTC) thermistor, a positive temperature coefficient (PTC) thermistor, a resistor, a capacitor, or an inductor.

12. The RF power device of claim 9, wherein a spacing distance between the transistor group and the temperature and RF characteristic detector is a minimum value of a range for preventing a short circuit of a layout design rule of each of the plurality of RF power transistors of the transistor group.

13. An RF power device comprising:
a transistor group having a plurality of RF power transistors connected with one another in parallel;
a pad physically spaced apart and electrically disconnected from the transistor group and configured to transmit a temperature and RF characteristic information of the transistor group to an outside; and
a temperature and RF characteristic detector connected between the pad and a source of an RF power transistor that is closest to the pad among the transistor group, and configured to detect the temperature and the RF characteristics of the transistor group,
wherein the transistor group, the pad, and the temperature and RF characteristic detector are manufactured on a same wafer.

14. The RF power device of claim 13, wherein each of the plurality of RF power transistors of the transistor group is manufactured with any one of GaAs, InP, GaN, or is a complementary metal oxide semiconductor (CMOS).

15. The RF power device of claim 13, wherein the temperature and RF characteristic detector is a negative temperature coefficient (NTC) thermistor, a positive temperature coefficient (PTC) thermistor, a resistor, a capacitor, or an inductor.

16. The RF power device of claim 13, wherein a spacing distance between the transistor group and the temperature and RF characteristic detector is a minimum value of a range for preventing a short circuit of a layout design rule of each of the plurality of RF power transistors of the transistor group.

* * * * *